_US012212300B2_

United States Patent
Oja et al.

(10) Patent No.: US 12,212,300 B2
(45) Date of Patent: Jan. 28, 2025

(54) MEMS RESONATOR WITH HIGH QUALITY FACTOR AND ITS USE

(71) Applicant: KYOCERA TECHNOLOGIES OY, Espoo (FI)

(72) Inventors: Aarne Oja, Espoo (FI); Antti Jaakkola, Espoo (FI); Panu Koppinen, Espoo (FI)

(73) Assignee: KYOCERA TECHNOLOGIES OY, Espoo (FI)

( * ) Notice: Subject to any disclaimer, the term of this patent is extended or adjusted under 35 U.S.C. 154(b) by 31 days.

(21) Appl. No.: 18/251,020

(22) PCT Filed: Sep. 23, 2021

(86) PCT No.: PCT/FI2021/050626
§ 371 (c)(1),
(2) Date: Apr. 28, 2023

(87) PCT Pub. No.: WO2022/096774
PCT Pub. Date: May 12, 2022

(65) Prior Publication Data
US 2023/0412140 A1    Dec. 21, 2023

(30) Foreign Application Priority Data
Nov. 6, 2020  (FI) .................................. 20206125

(51) Int. Cl.
*H03H 9/02*       (2006.01)
*H03H 3/007*      (2006.01)
(Continued)

(52) U.S. Cl.
CPC ........ *H03H 9/02448* (2013.01); *H03H 9/173* (2013.01); *H03H 3/0076* (2013.01); *H03H 2009/155* (2013.01)

(58) Field of Classification Search
CPC .. H03H 9/02448; H03H 9/173; H03H 9/0561; H03H 3/0076; H03H 2009/155; H03H 2009/02322
See application file for complete search history.

(56) References Cited

U.S. PATENT DOCUMENTS

2002/0190814 A1   12/2002  Yamada et al.
2007/0120625 A1    5/2007  Larson et al.
(Continued)

FOREIGN PATENT DOCUMENTS

WO    2020212648 A1    10/2020

OTHER PUBLICATIONS

European Patent Office, Notification of Transmittal of the International Search Report and the Written Opinion of the International Searching Authority, or the Declaration, Application No. PCT/FI2021/050626, mailed Jan. 10, 2022, 13 pages.
(Continued)

*Primary Examiner* — Jeffrey M Shin
(74) *Attorney, Agent, or Firm* — Ziegler IP Law Group LLC.

(57) ABSTRACT

A MEMS (microelectromechanical system) resonator with a material layer of single-crystalline silicon, at least one layer made of material with low thermal diffusivity to reduce thermoelastic dissipations in the MEMS resonator, a layer of piezoelectric material, and a layer made of electrically conducting material. The layer with low thermal diffusivity is between the single-crystalline silicon layer and the piezoelectric layer, or between the piezoelectric layer and the electrically conducting layer. The use of a material layer of low thermal diffusivity.

16 Claims, 3 Drawing Sheets

(51) Int. Cl.
*H03H 9/15* (2006.01)
*H03H 9/17* (2006.01)

(56) References Cited

U.S. PATENT DOCUMENTS

| | | |
|---|---|---|
| 2008/0297281 A1 | 12/2008 | Ayazi et al. |
| 2015/0091412 A1* | 4/2015 | Chen .................. H03H 9/02834 |
| | | 310/313 R |
| 2015/0180449 A1 | 6/2015 | Umeda et al. |
| 2016/0064642 A1 | 3/2016 | Nishimura et al. |
| 2016/0099703 A1 | 4/2016 | Jaakkola et al. |

OTHER PUBLICATIONS

Finnish Patent and Registration Office, Search Report, U.S. Appl. No. 20/206,125, Mailed Aug. 2, 2021, 2 pages.

* cited by examiner

MEMS RESONATOR WITH HIGH QUALITY FACTOR AND ITS USE

FIELD OF THE INVENTION

The present invention generally relates to microelectromechanical system, MEMS, resonators.

BACKGROUND OF THE INVENTION

This section illustrates useful background information without admission of any technique described herein representative of the state of the art.

Microelectromechanical system (MEMS) resonators are being developed to provide the same functionality as quartz resonators with benefits such as smaller chip size, reduced cost, and increased robustness against shock and vibrations. To achieve these goals, manufacturing of MEMS resonators exploits various wafer processing technologies used for manufacturing of integrated circuits.

A key performance parameter in MEMS resonators such as silicon MEMS resonators used for frequency reference applications is the equivalent series resistance (ESR). ESR is inversely proportional to the quality factor Q of the resonator, and thus the maximization of this parameter is often desirable. Other important features include low variation of the resonance frequency over the temperature range and good long-term stability (low ageing) of the resonance frequency.

SUMMARY

It is an object of certain embodiments of the invention to provide an optimized MEMS resonator or at least to provide an alternative to existing technology.

According to a first example aspect of the invention there is provided a MEMS (microelectromechanical system) resonator comprising:
 a material layer of single-crystalline silicon;
 at least one layer made of material with low thermal diffusivity;
 a layer of piezoelectric material; and
 a layer made of electrically conducting material, wherein the said layer with low thermal diffusivity is between the said single-crystalline silicon layer and the said piezoelectric layer, or between the said piezoelectric layer and the said electrically conducting layer.

In certain embodiments, the MEMS resonator comprises a material stack comprising the material layer of single-crystalline silicon, said at least one layer made of material with low thermal diffusivity, the layer of piezoelectric material, and the layer made of electrically conducting material, wherein the material stack is separated from a substrate by a cavity. In certain embodiments, the material stack forms a resonating element of the resonator.

In certain embodiments, the resonator comprises two layers of material with low thermal diffusivity and one of the said layers with low thermal diffusivity is between the said single-crystalline silicon layer and the said piezoelectric layer, and the other of the said layers with low thermal diffusivity is between the said piezoelectric layer and the said electrically conducting layer.

In certain embodiments, the spacing between the said layer with low thermal diffusivity and the said layer of piezoelectric material is less than 300 nanometers.

In certain embodiments, more than 50% of the resonator mass consists of silicon doped to an average impurity concentration of at least $2*10^{19}$ cm$^{-3}$.

In certain embodiments, the said layer with low thermal diffusivity and the said piezoelectric layer are in contact with each other.

In certain embodiments, the layer structure of the MEMS resonator is implemented without positioning a layer of single-crystalline silicon on both sides of the piezoelectric layer. In certain embodiments, the layer structure comprises a single-crystalline silicon only on one side of the piezoelectric layer.

In certain embodiments, the MEMS resonator comprises a top electrode patterned in the said electrically conducting layer.

In certain embodiments, the resonance mode of the MEMS resonator is a length-extensional mode.

In certain embodiments, the said layer made of material with low thermal diffusivity is made of silicon dioxide (in certain preferred embodiments, non-crystalline silica), $Al_2O_3$, or another oxide such as $TiO_2$ or $HfO_2$, $Si_3N_4$ or another nitride such as a nitride of Ti, Cr, or W in various stoichiometries, amorphous SiC, amorphous Si, amorphous AlN, or another amorphous material, or a combination of such materials.

In certain embodiments, the said layer made of material with low thermal diffusivity has a thickness between 20 nm and 1000 nm.

In certain embodiments, the said layer made of material with low thermal diffusivity has a thickness larger than 0.4 $\mu m \times (f/MHz)^{-1/2}$.

In certain embodiments, the said layer made of material with low thermal diffusivity has thermal diffusivity less than $20 \times 10^{-6}$ m$^2$/s.

In certain embodiments, the said piezoelectric layer is an AlN, Sc-doped AlN ($Al_{1-x}Sc_xN$), ZnO, $LiNbO_3$, or a $LiTaO_3$ layer.

In certain embodiments, the MEMS resonator comprises a layer of Mo between the said layer with low thermal diffusivity and the piezoelectric layer.

In certain embodiments, the resonance frequency of the MEMS resonator is 1 MHz or greater. In certain embodiments, the resonance frequency of the MEMS resonator falls within the range extending from 4 MHz to 250 MHz.

In certain embodiments, the resonator comprises elongated material portions with their longitudinal directions aligned parallel, or substantially parallel to a <100> crystalline direction, deviating at most 15 degrees from the <100> direction.

According to a second example aspect of the invention there is provided use of a material layer of low thermal diffusivity to reduce thermoelastic dissipations in a MEMS resonator (that comprises a material stack that is separated from a substrate by a cavity) by applying the said material layer (in the material stack) between a single-crystalline silicon layer and a piezoelectric layer and/or between the piezoelectric layer and an electrically conducting layer.

Different non-binding example aspects and embodiments have been presented in the foregoing. The above embodiments and embodiments described later in this description are used to explain selected aspects or steps that may be utilized in implementations of the present invention. It should be appreciated that corresponding embodiments apply to other example aspects as well. Any appropriate combinations of the embodiments can be formed.

BRIEF DESCRIPTION OF THE DRAWINGS

The invention will now be described, by way of example only, with reference to the accompanying drawings, in which.

DETAILED DESCRIPTION

In the following description, like numbers denote like elements.

Figure 1:
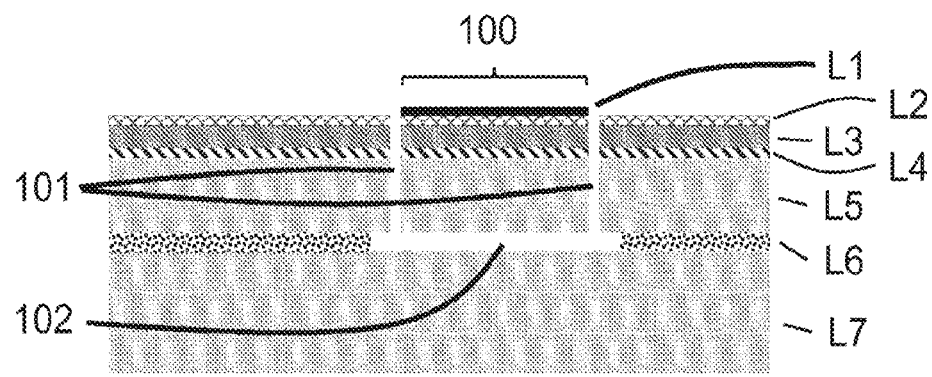
FIG. 1 shows a schematic cross-section of a MEMS resonator in accordance with certain embodiments.

FIG. 1 shows a schematic cross-section of a MEMS (microelectromechanical system) resonator 100 in accordance with certain embodiments. The cross section of the MEMS resonator 100 comprises a single-crystalline layer of silicon L5, a layer of piezoelectric material L3, a top electrode layer L1, and two layers L2 and L4 with low thermal diffusivity on both sides of the piezoelectric layer L3. The purpose of the layers L2 and L4 with low thermal diffusivity is to improve thermal isolation of the piezoelectric layer and thereby improve the quality factor Q of the MEMS resonator. The piezoelectric material (L3) can be, e.g., AlN, Sc-doped AlN, ZnO, LiNbO$_3$, or LiTaO$_3$. The top electrode material (L1) can be, e.g., metal such as gold, molybdenum, aluminium, a metal alloy, doped polycrystalline silicon, or another semiconducting material.

In embodiments illustrated in FIG. 1, the MEMS resonator 100 is patterned in a stack of layers comprising the above-mentioned layers L1-L5 by a micromachining process which creates vertical trenches 101 through the materials layers forming the resonator. The lateral dimensions of the resonator 100 are defined by the vertical trench 101. There is a cavity 102 below the resonator which separates the resonator from a substrate L7. The substrate L7 is typically a (part of) silicon wafer but it could also be made from another material. In typical embodiments, there is a layer of silicon oxide L6 between the substrate layer L7 and the silicon layer L5 in regions where there is no cavity. There are embodiments in which the layer L6 is from another material than silicon oxide, such as Al$_2$O$_3$ or another insulating material.

Figure 2:
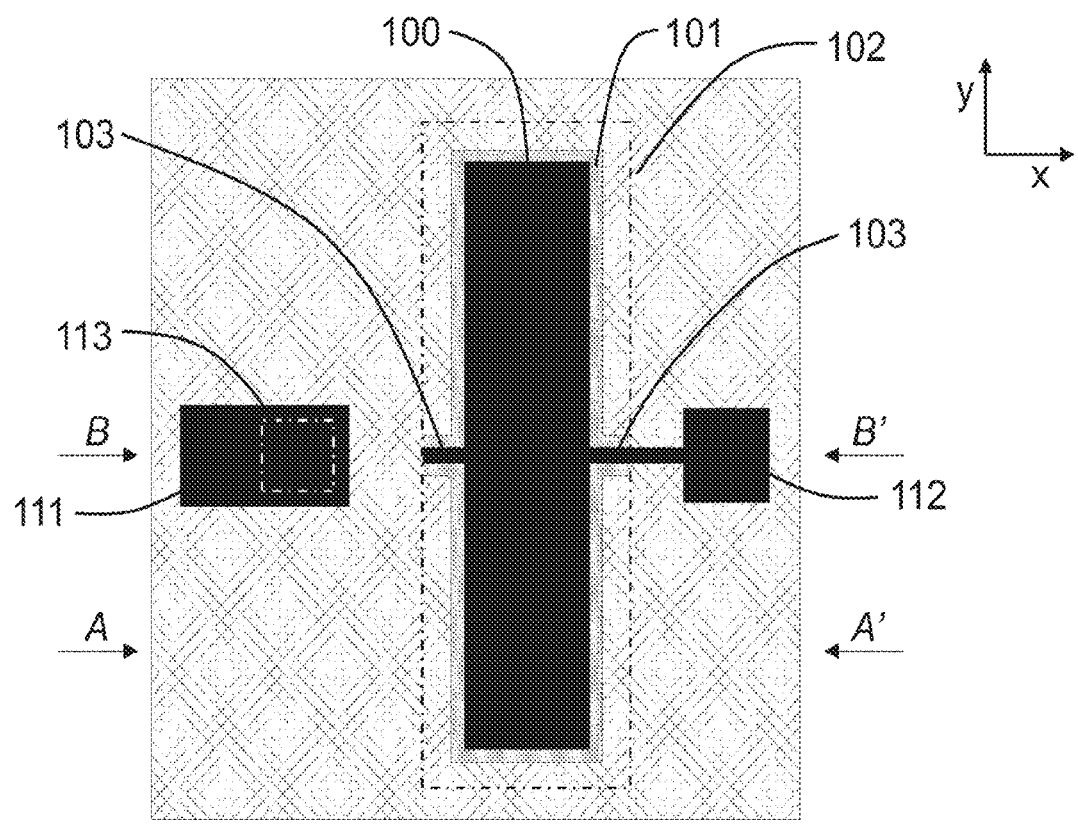
FIG. 2 shows a resonator layout with the material stack shown in FIG. 1 in accordance with certain embodiments.

FIG. 2 shows an example of the resonator layout with the material stack shown in FIG. 1 (the cross section AA' of FIG. 2 is illustrated in FIG. 1). The geometry of the resonator 100 is that of a length-extensional resonator with lateral dimensions defined by the vertical trench 101. The resonator is suspended by two beams 103 to a mechanically anchored region outside the cavity area 102. The dashed line 102 indicates the border line of the cavity 102 within the layer L6 between the substrate L7 and the silicon layer L5.

In some embodiments, the resonator 100 is galvanically connected to two electrical terminals 111, 112. The electrical terminals and the galvanic connections between the electrical terminals and the respective electrodes of the resonator are typically made of thin metallic layers such as molybdenum, aluminum, or gold, or a stack of thin metallic layers. The galvanically connected regions connected to the electrical terminals 111, 112 are patterned to provide electrical isolation between the two terminals.

Figure 3:
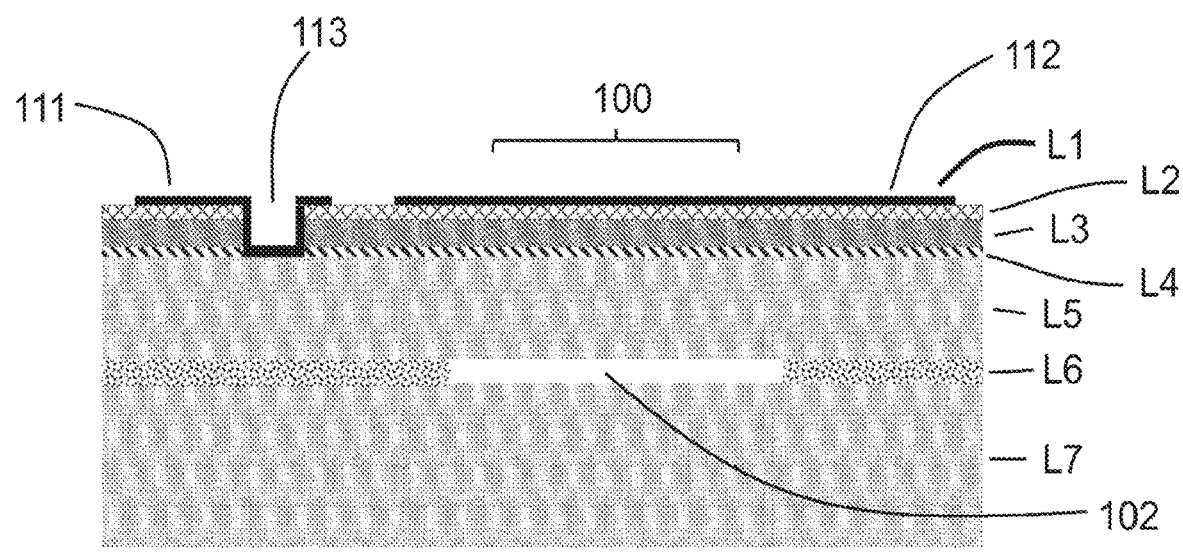
FIG. 3 shows a schematic cross section of the MEMS resonator of FIG. 2 along a section BB' to demonstrate structural details of electrical interconnections in accordance with certain embodiments.

An exemplary cross section of the MEMS resonator of FIG. 2 along the section BB' is presented in FIG. 3 to illustrate some structural details of the electrical interconnections in some embodiments. One of the interconnections (here: 111) provides an electrical path to the silicon layer L5 while the other interconnection (here: 112) provides an electrical path to the top electrode of the resonator 100 patterned in the layer L1. An opening 113 through the (upper) thermally insulating layer L2, the piezoelectric layer L3, and the (lower) thermally insulating layer L4 is provided so that the metal deposited at the terminal 111 provides a galvanic contact to the silicon layer L5.

In certain other embodiments, the layout of the electrical terminals 111, 112, the layout of the resonator 100 and the vertical trench 101, the cavity 102, and the structure of the opening 113 differ from that illustrated in FIG. 2, and the number of electrical terminals of the resonator can be two, three, or more.

In certain embodiments, the single crystalline silicon layer L5 is degenerately doped using phosphorus, arsenic, lithium, boron, or other dopants, or a combination of different dopants. More than 50% of the resonator mass consists of degenerately doped silicon, and/or the resonator comprises a body of silicon doped to an average impurity concentration of at least $2\times10^{19}$ cm$^{-3}$, such as at least $10^{20}$ cm$^{-3}$. The doping can be either homogeneous or inhomogeneous within the layer L5. Strong doping of silicon is useful for reducing the thermal dependency of the Young's modulus of silicon which in turn reduces temperature dependency of the resonance frequency of the MEMS resonator. In particular, degenerate n-type phosphorous doping may be used to reduce the thermal dependence of MEMS resonators. There are several techniques available for strong phosphorous doping such as PSG-doping, POCl$_3$ doping, ion implantation, and use of phosphorous oxide (P$_2$O$_5$) doping wafers.

For optimization of the frequency vs. temperature characteristics of the MEMS resonator, the resonator geometry has in certain embodiments a certain alignment with respect to the crystalline axes of the single-crystalline silicon portion of the resonator structure. In certain embodiments, the crystalline directions in the single-crystalline silicon layer L5 are such that a <100> direction such as [010] is in the plane of the layer L5. In certain embodiments, there are two <100> crystalline directions such as [100] and [010] in the plane of the layer L5. In certain embodiments, the resonator comprises elongated material portions such as beams or interconnected beam elements. In such resonators, it is advantageous if the alignment of the longitudinal direction of said elongated material portions is parallel, or substantially parallel to a <100> crystalline direction, such as within 15 degrees or less. For example, in the length-extensional resonator illustrated in FIG. 2 it is advantageous if the side of the beam (the y direction) is parallel to a <100> crystalline direction (such as [010]).

In certain embodiments, the thickness of the silicon layer L5 is in the range of 2 μm to 40 μm.

In certain embodiments, the thickness of the piezoelectric layer L3 is in the range of 1 μm to 3 μm.

In certain embodiments, the thickness of the top electrode layer L1 is in the range of 0.05 μm to 1 μm such as from 0.1 μm to 0.4 μm.

To analyze the role of the thermally insulating material layers L2 and L4 in improving the quality factor Q of the resonator, we discuss thermoelastic properties of a material under vibration. When a material is stressed in an adiabatic (i.e. isentropic) process, there is a change in its temperature which depends on its material properties. To a first approximation, mechanical resonance can be described as an adiabatic, standing elastic wave in a solid material. In piezo-coupled MEMS resonators there are several material layers (such as a single-crystalline silicon layer, piezoelectric layer, and a metallic top electrode). Since the temperature changes are different in different material layers during the mechanical vibration, heat flows between different material layers which dissipates vibrational energy and thereby decreases the Q value. The temperature increase is especially large in the piezoelectric layer. Therefore, according to the present invention, the overall energy dissipation can be reduced (and the Q value can be increased) by providing thermally insulating material layers L2 and L4 on both sides, or at least on one side, of the piezoelectric layer.

For an isotropic material, the thermoelastic effect is given by $$\left(\frac{\partial T}{\partial \sigma_{kk}}\right)_S = -\frac{\beta}{\rho C_p} T$$

where T is the absolute temperature, $\sigma_{kk}$ is the hydrostatic stress, the subscript S denotes isentropic process, $\beta$ is the linear coefficient of thermal expansion, $\rho$ is the density, and $c_p$ is the heat capacity. In a length-extensional mode, the stress $\sigma_{kk}$ along the direction of the (longitudinal) vibration, is given by $\sigma_{kk,i} = \varepsilon E_i^S$ where $E_i^S$ is the adiabatic Young's modulus, the subscript i refers to the respective material layer, and the strain E is the same for all the layers. The equation $$\Delta T_i = -\frac{\beta_i E_i^S}{\rho_i C_{pi}} T \varepsilon$$

with T=300 K and $\varepsilon = 10^{-4}$ yields the following temperature changes for (the layer L5 material) single-crystalline Si, (layer L3 material) piezoelectric AlN, and (alternative layer L1 materials) Al, Mo, and Au:

ΔT(Si)=0.008 K,
ΔT(AlN)=0.20 K,
ΔT(Al)=0.020 K,
ΔT(Mo)=0.017 K,
ΔT(Au)=0.009 K.

These values represent the amplitudes of the temperature changes which oscillate sinusoidally at the frequency of the mechanical vibration. The temperature changes are different in different material layers and therefore there is a heat flow across the interfaces of material layers which also oscillates at the frequency of the mechanical vibration. The calculated values show that thermoelastic temperature changes in AlN are an-order-of-magnitude larger than the corresponding temperature changes in Si or typical top-electrode metal films.

Thermoelastic losses depend not only on the temperature difference across the material interfaces but also on thermal conductivities and heat capacities of the materials on both sides of the interface. These properties are accounted for by thermal diffusivity $$\alpha = \frac{\kappa}{\rho c_p}$$

where $\kappa$ is the thermal conductivity. Thermal diffusivity of AlN is relatively large which tends to increase thermoelastic losses. To further elaborate this point, it is instructive to calculate the thickness of a material layer which essentially comes into dynamic thermal equilibrium during a half-cycle of the period of vibration, namely $d_{th} = \sqrt{\alpha/(2f)}$, where f is the frequency. As an illustrative example, we calculate $d_{th}$ for a 24 MHz length-extensional resonator for (the layer L5 material) single-crystalline Si, (layer L3 material) piezoelectric AlN, and (alternative layer L1 materials) Al, Mo, and Au:

$d_{th}$(Si)=1.3 µm,
$d_{th}$(AlN)=0.78 µm,
$d_{th}$(Al)=1.4 µm,
$d_{th}$(Mo)=1.0 µm,
$d_{th}$(Au)=1.6 µm.

Here we have used the following values for thermal diffusivities: $\alpha$(Si)=78×10$^{-6}$ m$^2$/s, $\alpha$(AlN)=29×10$^{-6}$ m$^2$/s, $\alpha$(Al)=97×10$^{-6}$ m$^2$/s, $\alpha$(Mo)=48×10$^{-6}$ m$^2$/s, and $\alpha$(Au)=126×10$^{-6}$ m$^2$/s. Since the calculated values $d_{th}$ are comparable to a typical layer thickness for the piezoelectric layer (L3) in a piezo-coupled MEMS resonator, a significant portion of the piezoelectric AlN layer is (dynamically) thermalized due to the heat flow between the silicon layer (L5) and the piezoelectric layer and the heat flow between the piezoelectric layer and the top electrode layer (L1). This dissipates vibrational energy and thereby decreases the Q value.

According to embodiments of the present invention, thermoelastic energy losses can be reduced by providing thermally insulating material layers (L2 and L4) on both sides, or at least on one side (L2 or L4), of the piezoelectric layer. Examples of such materials include $SiO_2$ (in certain embodiments, non-crystalline silica), $Al_2O_3$, other oxides such as $TiO_2$, $HfO_2$, $Si_3N_4$ (silicon nitride) and other nitrides of various materials such as Ti, Cr, and W in various stoichiometries, amorphous SiC (a-SiC), amorphous Si (a-Si) and other amorphous materials including amorphous AlN (a-AlN), or a combination of such materials.

In the exemplary case of the f=24 MHz length-extensional resonator, we list below thicknesses $d_{th} = \sqrt{\alpha/(2f)}$ of some thermally insulating material layers which essentially come into dynamic thermal equilibrium during a half-cycle of the period of vibration:

$d_{th}$(SiO$_2$)=0.13 µm,
$d_{th}$(Al$_2$O$_3$)=0.50 µm,
$d_{th}$(TiO$_2$)=0.19 µm,
$d_{th}$(HfO$_2$)=0.14 µm,
$d_{th}$(Si$_3$N$_4$)=0.18 µm,
$d_{th}$(a-SiC)=0.11 µm,
$d_{th}$(a-Si)=0.54 µm,
$d_{th}$(a-AlN)=0.13 µm.

Here we have used the following values for thermal diffusivities: $\alpha$(SiO$_2$)=0.8×10$^{-6}$ m$^2$/s, $\alpha$(Al$_2$O$_3$)=12×10$^{-6}$ m$^2$/s, $\alpha$(TiO$_2$)=1.8×10$^{-6}$ m$^2$/s, $\alpha$(HfO$_2$)=0.9×10$^{-6}$ m$^2$/s, $\alpha$(Si$_3$N$_4$)=1.5×10$^{-6}$ m$^2$/s, $\alpha$(a-SiC)=0.6×10$^{-6}$ m$^2$/s, $\alpha$(a-Si)=14×10$^{-6}$ m$^2$/s, $\alpha$(a-AlN)=0.8×10$^{-6}$ m$^2$/s. The thicknesses $d_{th}$ for several above-mentioned poor conductors, SiO$_2$, Si$_3$N$_4$, HfO$_2$, a-SiC, and a-AlN are significantly smaller than the thicknesses $d_{th}$ for Si, AlN, Al, Mo, and Au used in piezo-actuated MEMS resonators. Therefore, by providing a material layer L2 and/or L4 comprising of such a material with the thickness from 20 nm to 1000 nm, such as from 50 nm to 200 nm, it is possible to significantly reduce thermoelastic dissipations of MEMS resonators and to significantly increase the quality factor Q and thereby to decrease ESR.

The above numerical examples use AlN as the piezoelectric material in the layer L3. However, some embodiments of the present invention have another piezoelectric material in the material layer L3 such as Sc-doped AlN ($Al_{1-x}Sc_xN$), ZnO, $LiNbO_3$, or $LiTaO_3$.

In some embodiments, thermally insulating layer (L2 and/or L4) is deposited using the same processing tool which is used for deposition of the piezoelectric layer L3 by changing the process parameters to yield an amorphous thin film during the deposition of the L2 and/or L4 layer (such as amorphous AlN which is not piezoelectric), and a piezoelectric thin film during the deposition of the L3 layer (such as piezoelectric AlN).

Introduction of the material layers L2 and L4 in the resonator structure does increase the number of material interfaces in the resonator structure which tends to increase thermoelastic losses. However, the exceptionally large thermoelastic loss in a piezoelectric material such as AlN, combined with the low thermal conductivity of the properly chosen insulating material in the layer L2 and/or L4, have the consequence that overall thermoelastic losses are reduced.

The thickness $d_{th}=\sqrt{\alpha/(2f)}$ of the thermally insulating material layer which essentially comes into dynamic thermal equilibrium during a half-cycle of the period of vibration is inversely proportional to the square root of the frequency. Therefore, films of thermally insulating layers (L2 and/or L4) with thicknesses in the range from 20 nm to 1000 nm can effectively reduce thermal losses during vibrations over a large frequency range. In certain embodiments, the resonance frequency of the MEMS resonator is 1 MHz or greater. In certain embodiments, the resonance frequency of the MEMS resonator falls within the range extending from 4 MHz to 250 MHz. In certain embodiments, films of thermally insulating layers (L2 and/or L4) have thicknesses larger than $0.4\ \mu m \times (f/MHz)^{-1/2}$.

In some embodiments, the crystalline c-axis of the piezoelectric layer L3 is parallel to the direction orthogonal to the wafer plane. In some embodiments, the crystalline c-axis of the piezoelectric layer L3 is at an angle larger than zero and smaller than 90 degrees with respect to the direction orthogonal to the wafer plane.

Figure 4:
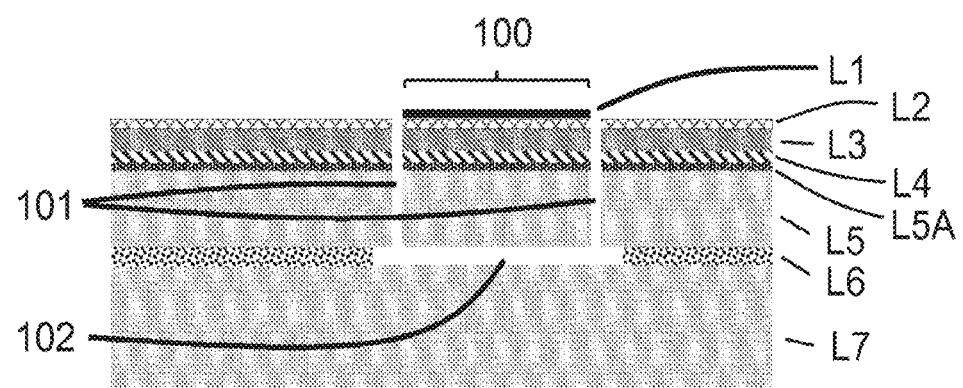
FIG. 4 shows a schematic cross-section of a MEMS resonator comprising a separate bottom electrode layer in accordance with certain embodiments.

In certain other embodiments, a separate bottom electrode layer L5A is provided between the single-crystalline silicon layer L5 and the thermally insulating layer L4. Such a material stack has been illustrated in FIG. 4. The material of the bottom electrode layer L5A may be Al, Mo, Au, polysilicon or any other suitable material that is electrically conductive. The thickness of the L5A layer can be in the range 100 nm ... 500 nm, for example. There may be seed layers between L5 and L5A, such as layers of Ti, W, or Cr, to facilitate growth and adhesion of the bottom electrode material, and to prevent solid-state diffusion between the layers L5 and L5A.

Figure 5:
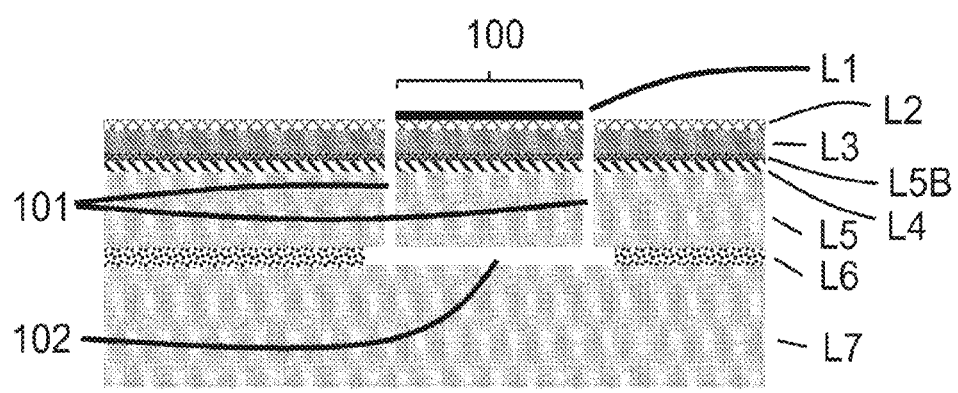
FIG. 5 shows a schematic cross-section of a MEMS resonator in accordance with yet another embodiment.

In certain other embodiments, a separate thin bottom electrode layer L5B is provided between the thermally insulating layer L4 and the piezoelectric layer L3. Such a material stack has been illustrated in FIG. 5. The material of the bottom electrode layer L5B may be Al, Mo, Au, polysilicon or any other suitable material that is electrically conductive, or a layered stack of such materials. Thickness of the L5B layer can be in the range 50 nm ... 300 nm. In the exemplary case of a 24 MHz resonator, bottom electrode layer L5B with a thickness below 300 nm sandwiched between the thermally insulating layer L4 with a thickness larger than 100 nm and the piezoelectric layer L3 reduces overall thermoelastic energy losses in comparison to the case with a resonator with no thermally insulating layer L4. From the manufacturing point of view, a practical embodiment is a resonator where the insulating layer L4 is formed from a thermally grown silicon oxide and Mo is sputtered to form the thin bottom electrode layer L5B as this material is also a good seed layer for sputtering piezoelectric AlN and Sc-doped AlN (for the layer L3).

In embodiments which use the layer L5B as the bottom electrode, a galvanic contact between an electrical terminal of the resonator and the bottom electrode is made by providing an opening through the (upper) thermally insulating layer L2 (in case there is a L2 layer in the material stack) and the piezoelectric layer L3, and by providing an electrically conducting pattern which galvanically connects the said electrical terminal to the bottom electrode layer L5B.

In certain embodiments, there is a thin seed layer between the thermally insulating layer L4 and the piezoelectric layer L3, for example to facilitate the growth of the piezoelectric layer L3 with good piezoelectrical properties. The thickness of the seed layer between the layers L4 and L3 can be in the range from 10 nm to 100 nm, or up to 300 nm, and the material of the seed layer can be Mo, for example. In the exemplary case of a 24 MHz resonator, a metallic seed layer with a thickness below 300 nm sandwiched between the piezoelectric layer L3 and the thermally insulating layer L4 with a thickness larger than 100 nm reduces overall thermoelastic energy losses in comparison to the case with a resonator with no thermally insulating layer L4. The material stack of such a resonator is according to the illustration of FIG. 5 in which the layer L5B is the seed layer which is electrically floating (and therefore there is no need for a galvanic contact to the layer L5B).

In certain other embodiments, the resonator has different geometries and different vibration modes such as flexural resonators with or without coupling elements and tuning fork resonators vibrating either in-plane or out-of-plane, square-extensional mode or Lame-mode resonators, various spring-mass resonators with or without coupling elements vibrating in-plane or out-of-plane, various length-extensional resonators with coupling elements, and various beam-shaped resonators with or without coupling elements.

Without limiting the scope and interpretation of the patent claims, certain technical effects of one or more of the example embodiments disclosed herein are listed in the following. A technical effect is a high quality factor (Q) and a low equivalent series resistance (ESR).

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A MEMS (microelectromechanical system) resonator comprising:
   a material layer of single-crystalline silicon;
   two layers made of material with a thermal diffusivity less than $20 \times 10^{-6}$ m$^2$/s;
   a layer of piezoelectric material; and
   a layer made of electrically conducting material,
   wherein one of said layers with the thermal diffusivity is between the said single-crystalline silicon layer and the said piezoelectric layer, and the other of said layers with the thermal diffusivity is between the said piezoelectric layer and the said electrically conducting layer.

2. The MEMS resonator of claim 1, wherein the spacing between at least one of the said layers with the thermal diffusivity and the said layer of piezoelectric material is less than 300 nanometers.

3. The MEMS resonator of claim 1, wherein more than 50% of the resonator mass consists of silicon doped to an average impurity concentration of at least $2*10^{19}$ cm$^{-3}$.

4. The MEMS resonator of claim 1, wherein at least one of the said layers with the thermal diffusivity and the said piezoelectric layer are in contact with each other.

5. The MEMS resonator of claim 1, wherein the layer structure of the MEMS resonator is implemented without positioning a layer of single-crystalline silicon on both sides of the piezoelectric layer.

6. The MEMS resonator of claim 1, comprising a top electrode formed by a pattern in the said electrically conducting layer.

7. The MEMS resonator of claim 1, wherein the resonance mode of the MEMS resonator is a length-extensional mode.

8. The MEMS resonator of claim 1, wherein at least one of the said layers made of material with the thermal diffusivity is made of one or more of: an oxide, silicon dioxide, Al2O3, TiO2, HfO2, Si3N4, a nitride, a nitride of Ti, Cr, or W, an amorphous material, amorphous SiC, amorphous Si, or amorphous AlN.

9. The MEMS resonator of claim 1, wherein the said layer made of material with the thermal diffusivity has a thickness between 20 nm and 1000 nm.

10. The MEMS resonator of claim 1, wherein the said layer made of material with the thermal diffusivity has a thickness larger than 0.4 μm×(f/MHz)$^{-1/2}$.

11. The MEMS resonator of claim 1, wherein the said piezoelectric layer is an AlN, Sc-doped AlN (Al$_{1-x}$Sc$_x$N), ZnO, LiNbO$_3$, or a LiTaO$_3$ layer.

12. The MEMS resonator of claim 1, comprising a layer of Mo between at least one of the said layers with the thermal diffusivity and the piezoelectric layer.

13. The MEMS resonator of claim 1, wherein the resonance frequency of the MEMS resonator is 1 MHz or greater.

14. The MEMS resonator of claim 1, wherein the resonance frequency of the MEMS resonator falls within the range extending from 4 MHz to 250 MHz.

15. The MEMS resonator of claim 1, wherein the resonator comprises elongated material portions with their longitudinal directions aligned parallel, or substantially parallel to a <100> crystalline direction, deviating at most 15 degrees from the <100> direction.

16. Use of two material layers having a thermal diffusivity less than $20 \times 10^{-6}$ m$^2$/s, to reduce thermoelastic dissipations in a MEMS resonator by applying one of said material layers with the thermal diffusivity between a single-crystalline silicon layer and a piezoelectric layer and the other of said layers with the thermal diffusivity between the piezoelectric layer and an electrically conducting layer.

* * * * *